United States Patent [19]

Hida

[11] Patent Number: 4,980,731
[45] Date of Patent: Dec. 25, 1990

[54] ATOMIC PLANAR-DOPED FIELD-EFFECT TRANSISTOR

[75] Inventor: Hikaru Hida, Tokyo, Japan

[73] Assignee: NEC Corporation, Tokyo, Japan

[21] Appl. No.: 296,804

[22] Filed: Jan. 13, 1989

[30] Foreign Application Priority Data

Jan. 14, 1988 [JP] Japan .................................. 63-7180

[51] Int. Cl.$^5$ ............................................ H01L 29/80
[52] U.S. Cl. ........................................ 357/22; 357/16
[58] Field of Search ................ 357/22, 16, 23.2, 23.15

[56] References Cited

U.S. PATENT DOCUMENTS

| 4,157,556 | 6/1979 | Decker et al. | 357/22 A |
| 4,641,161 | 2/1987 | Kim et al. | 357/16 |
| 4,727,403 | 2/1988 | Hida et al. | 357/22 A |

FOREIGN PATENT DOCUMENTS 0017531 10/1980 European Pat. Off. .............. 357/22

OTHER PUBLICATIONS

Japanese Journal of Applied Physics, vol. 24, No. 8, pp. L608–L610 (1985) by Schubert et al.
IEEE Transactions on Electron Devices, vol. ED-33, No. 5, pp. 625–632 (1986) by Schubert et al.

Primary Examiner—Andrew J. James
Assistant Examiner—Mark Prenty
Attorney, Agent, or Firm—Burns, Doane, Swecker & Mathis

[57] ABSTRACT

An atomic planar-doped field-effect transistor is disclosed, which is featured by a channel region of a limited thickness between source and drain with at least one atomic planar-doped layer formed therein and a barrier layer or layers provided on the upper or lower side or on the both sides of the channel region. The channel region is formed of a semiconductor of a low impurity concentration or of an n-type with the atomic planar-doped layer having high concentration donor impurities or of a p-type with the atomic planar-doped layer having high concentration acceptor impurities. The upper barrier layer is provided between the channel region and a gate electrode and the lower barrier layer, if present, is provided between the channel region and a substrate. They are formed of a semiconductor of a low impurity concentration which is different from the semiconductor of the channel region and makes a heterojunction with the channel region and which has a smaller electron affinity than the semiconductor of the channel region having the donor planar-doped layer or a larger value of a sum of electron affinity and energy gap than the semiconductor of the channel region having the acceptor planar-doped layer. With the upper barrier layer, the transistor of the present invention has a large gate-forward turn-on voltage. The short channel effects are suppressed by adding the lower barrier layer to the transistor.

9 Claims, 3 Drawing Sheets 4,980,731

ATOMIC PLANAR-DOPED FIELD-EFFECT TRANSISTOR

BACKGROUND OF THE INVENTION

The present invention relates to improvement of a δ-doped field-effect transistor, or an atomic planar-doped field-effect transistor, such as GaAs FET, InP FET or InGaAs FET which has a δ-doped, or atomic planar-doped, layer in its channel region.

The δ-doped, or atomic planar-doped, field-effect transistor has been proposed by Schubert et al. in JAPANESE JOURNAL OF APPLIED PHYSICS, Vol. 24, No. 8 AUGUST, 1985, pp. L608-L610 and in IEEE TRANSACTIONS ON ELECTRON DEVICES, VOL. ED-33, No. 5, MAY, 1986, pp. 625-632. Since it is basically a Schottky-gate FET, the maximum usable gate-forward voltage $V_{Gmax}$, or the gate-forward turn-on voltage, is as low as about 0.7 eV and a sufficient noise margin cannot be achieved in an LSI employing the atomic planar-doped transistors. Moreover, the short channel effects tend to occur in the proposed atomic planar-doped field-effect transistor.

SUMMARY OF THE INVENTION

It is therefore an object of the present invention to provide an improved, atomic planar-doped field-effect transistor which has a large gate-forward turn-on voltage $V_{Gmax}$.

It is another object of the present invention to provide an improved, atomic planar-doped field-effect transistor in which the short channel effects are suppressed.

It is a further object of the present invention to provide an atomic planar-doped field-effect transistor for high-frequency and high-speed operation in which the short channel effects are suppressed and which has a high gate-forward turn-on voltage, a high breakdown voltage and a large current-driving capability.

The atomic planar-doped field-effect transistor according to the present invention is featured by a channel region of a limited thickness between source and drain, in which region at least one atomic planar-doped layer is formed, and a barrier layer or layers provided on the upper or lower side or on the both sides of the channel region. The channel region is formed of a semiconductor of a low impurity concentration or of an n-type with the atomic planar-doped layer having high connection donor impurities or of a p-type with the atomic planar-doper layer having high connection acceptor impurities. The upper barrier layer is provided between the channel region and a gate electrode and the lower barrier layer, if present, is provided between the channel region and a substrate. They are formed of a semiconductor of a low impurity concentration which is different from the semiconductor of the channel region and forms a heterojunction with the channel region and which has a smaller electron affinity than the semiconductor of the channel region having the donor planar-doped layer or a larger value of a sum of electron affinity and energy gap than the semiconductor of the channel region having the acceptor planar-doped layer. The semiconductor material of the upper barrier layer and that of the lower barrier layer may be the same or different from each other. A buffer layer of a low impurity concentration and of the same semiconductor material as the substrate may be added to cover the surface of the substrate and the lower barrier layer may have a p-type region at or near the interface with the channel region having the donor planar-doped layer. The upper barrier layer may be formed of an insulating material.

With the upper barrier layer, the field-effect transistor of the present invention has a large gateforward turn-on voltage. The short channel effects are suppressed by adding the lower barrier layer to the transistor.

DESCRIPTION OF THE PRIOR ART

Figure 1:
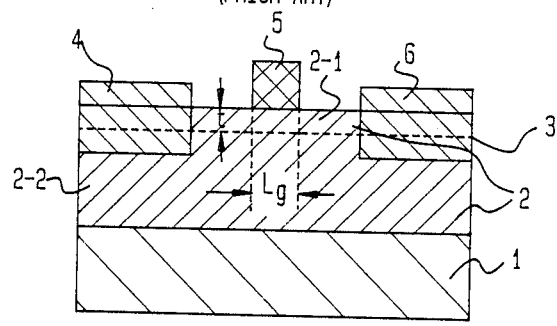
FIG. 1 is a schematic sectional view of a prior art planar-doped FET.

Referring to FIG. 1, a prior art planar-doped FET comprises a semi-insulating GaAs substrate 1, an undoped GaAs layer 2 formed on the substrate 1, a planar-doped layer 3 of donor impurity with a very high impurity concentration of $7.5 \times 10^{18}$ cm$^{-3}$ which divides the undoped GaAs layer 2 into the upper part 2-1 and the lower part 2-2, a source electrode 4, a gate electrode 5 making a Schottky contact with the surface of the upper part GaAs layer 2-1, and a drain electrode 6.

Figure 2:
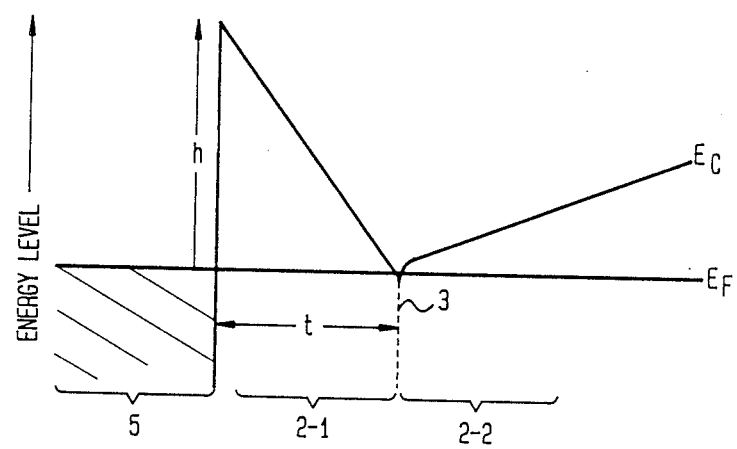
FIG. 2 is a part of an energy-band diagram for the prior art planar-doped FET shown in FIG. 1.

FIG. 2 shows an energy band right under the gate electrode 5 of the device of FIG. 1 in the thermal equilibrium condition, illustrating an energy level $E_C$ of the lower end of a conduction band and a Fermi level $E_F$. The planar-doped layer 3 forms a channel, and the height h of the energy level $E_C$ at the interface between the gate electrode 5 and the upper part undoped GaAs layer 2-1 amounts to 0.7 eV of the Schottky barrier.

When a gate forward voltage applied to the gate electrode 5 exceeds +0.7 eV with the source electrode 4 grounded and the drain electrode 6 fixed at a positive potential, the quasi Fermi level exceeds the height h of the level $E_C$, so that electrons flow from the channel region 3 to the gate electrode 5 and a gate current starts flowing toward the source electrode 4. As a result, the gate voltage can no more control the channel current. Therefore, the maximum usable gate-forward voltage $V_{Gmax}$, that is, the gate-forward turn-on voltage, is as low as about 0.7 eV in the prior art planar-doped FET. This restricts the noise margin in designing an integrated circuit.

The short channel effects include a large amount of shift of a threshold voltage to the negative side and an increase in a drain conductance gd and depend on the aspect ratio Lg/t of the channel, where Lg represents a length of the gate electrode as shown in FIG. 1 and, t denotes a depth of the channel region as indicated in FIGS. 1 and 2. The channel aspect ratio must not be decreased in order to suppress the short channel effects.

In operation of the prior art planar-doped FET, however, carrier electrons which flow from the source electrode 4 to the drain electrode 6 are spread beyond the planar-doped region 3 and a majority of the carrier electrons transit through the upper and lower part undoped GaAs layers 2-1 and 2-2. In other words, the elective channel region is expanded upwards and downwards in operation, and the channel depth t is increased. Accordingly, it is impossible to suppress the short channel effects.

DESCRIPTION OF THE INVENTION

Figure 3:
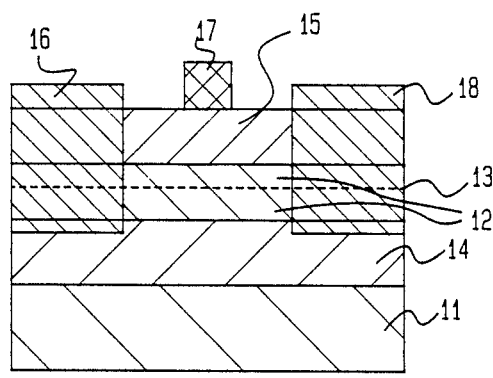
FIG. 3 is a schematic sectional view of a planar-doped FET embodying the present invention.

Referring to FIG. 3, a planar-doped FET embodying the present invention comprises a high-resistivity substrate 11 such as semi-insulating GaAs, a lower semiconductor barrier layer 14 of, for example, $Al_xGa_{1-x}As$ ($0<x\leq1$) formed on the substrate 11 and having a thickness of 300 Å or more and an impurity concentration of $1\times10^{16}$ to $1\times10^{12}$ cm$^{-3}$, and a thin semiconductor layer 12 (for the 33 channel region) thereon of a semiconductor material having a larger electron affinity than the semiconductor of the barrier layer 14 or 15 (mentioned below), such as GaAs, for a donor-planar-doped layer 13 (mentioned below) or having a smaller value of a sum of electron affinity and energy gap than the semiconductor of the barrier layer, for example, Ge, for an acceptor-planar-doped layer 13. The thin channel layer 12 has a low impurity concentration of $1\times10^{16}$ to $1\times10^{12}$ cm$^{-3}$ and a small thickness of 2,000 Å (0.2 μm) to 10 Å. The atomic planar-doped layer 13 is formed within the thin channel layer 12. The doped layer 13 has a high impurity concentration of $1\times10^{14}$ to $1\times10^{11}$ cm$^{-2}$ (impurity sheet density). It is n-type where donors such as Si, S and Se are planar-doped and is p-type where acceptors such as Be are planar-doped. Its thickness ranges from a size of one atom to that of a plurality of atoms, that is, from several Å (about 3 Å for Si) to 50 Å.

The FET further comprises an upper barrier layer 15 formed on the thin channel layer 12 and of a semiconductor having a smaller electron affinity or a larger sum of electron affinity and energy gap than the semiconductor of the channel layer 12, for example, $Al_yGa_{1-y}As$ ($0<y\leq1$ and favorably $0.2\leq y\leq0.5$). It has a low impurity concentration of $1\times10^{16}$ to $1\times10^{12}$ cm$^{-3}$ and its thickness is 2,000 Å to 10 Å. Ohmic electrodes 16 and 18 for source and drain are provided and a Schottky electrode 17 for the gate (e.g. Al, WSi or Ti-Pt-Au) is formed on the upper barrier layer 15 between the source and drain electrodes 16 and 18.

Figure 4:
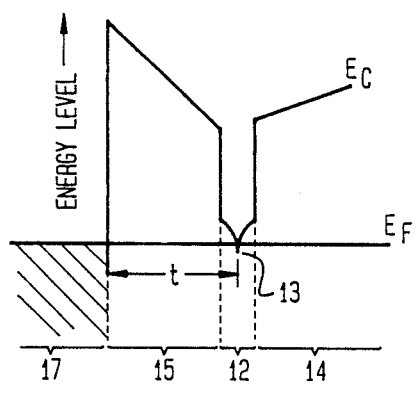
FIG. 4 is a part of an energy-band diagrams for the planar-doped FET according to one embodiment of the present invention to which no gate voltage is applied.
Figure 5:
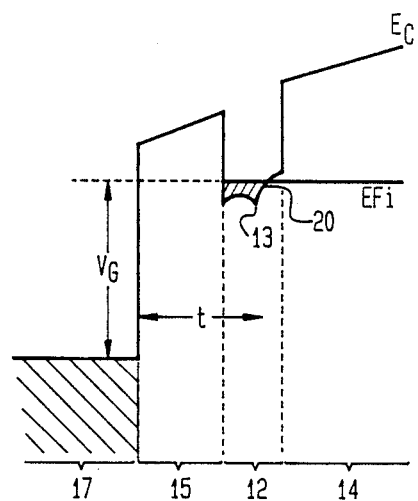
FIG. 5 is a part of an energy-band diagram for the planar-doped FET according to the one embodiment of the present invention to which a gate forward voltage is applied.

Examples of the combinations of semiconductor materials for the channel layer 12 and the barrier layer 14 or 15 are GaAs and AlGaAs, InGaAs and GaAs, InGaAs and InAlAs, InP and InAlAs, InP and GaAs, InP and AlGaAs, and Ge and Si for carrier electrons; and Ge and GaAs, Ge and AlGaAs, and GaAs and AlGaAs for carrier holes.

Where the FET has the donor (n-type) planar-doped layer 13, the energy band under the gate electrode 17 becomes as shown in FIG. 4 in the thermal equilibrium condition. The lower-end energy level of the conduction band $E_C$ is low and near the Fermi level $E_F$ at the channel layer 12, but is high above the Fermi level $E_F$ at the barrier layers 15 and 14. When a gate forward voltage $V_G$ (positive) is applied to the gate electrode 17 with the source electrode 16 grounded and the drain electrode 18 fixed at a positive potential, the quasi Fermi level $E_{Fi}$ is pinned at the channel layer 12 due to the presence of the planar-doped layer 13 and the energy level $E_C$ at the upper barrier layer 15 becomes reversely inclined, that is, the energy level $E_C$ at the interface between the barrier layer 15 and the channel layer 12 becomes higher than the energy level $E_C$ (about 0.7 eV) at the interface between the gate electrode 17 and the barrier layer 15, as shown in FIG. 5. The higher energy level at the upper barrier layer 15 prevents flow of electrons from the channel region 12 to the gate electrode 17. Accordingly, the gate-forward turn-on voltage $V_{Gmax}$ is enhanced to, for example, 1.4 eV.

The higher energy level $E_C$ at the lower barrier layer 14, as shown in FIG. 5, also prevents electrons from being expanded into the barrier layer 14. Thus, the electrons are not spread beyond the channel layer 12 in operation, so that the effective channel depth t is not increased toward the lower barrier layer 14. Therefore, the channel aspect ratio Lg/t is not substantially increased even in operation and the short channel effects can be suppressed.

Because of the inclination of the energy level $E_C$ at the upper barrier layer 15 downward to the left-hand side, as shown in FIG. 5, the so-called two-dimensional electrons 20 are accumulated on the hetero-interface of the channel layer 12 with the upper barrier layer 15 according to the Gauss' theorem. The surface density of these two-dimensional electrons 20 becomes large as the inclination of $E_C$ at the barrier layer is steep and can be increased by increasing the gate voltage $V_G$, and thereby carrier electrons can be increased effectively. Generally, the two-dimensional electrons are affected little by impurity scattering. Therefore they can move at a high speed. The presence of the two-dimensional electrons contributes to increase in the current-driving capability of the FET of the invention.

Figure 6:
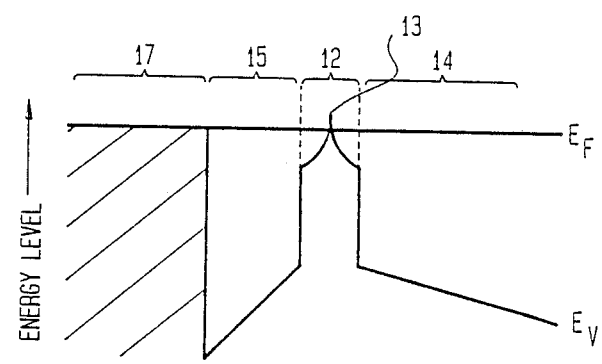
FIG. 6 is a part of an energy-band diagram for a planar-doped FET according to another embodiment of the present invention where no voltage is applied to its gate electrode.

FIG. 6 shows the upper-end energy level $E_V$ of the valence band at the layers 12 to 15 when the FET has the acceptor (p-type) planar-doped layer 13.

It can be seen from the foregoing description that a high-speed FET having a $V_{Gmax}$ and a high current-driving capability can be realized according to the present invention.

EMBODIMENT 1

An undoped $Al_{0.3}Ga_{0.7}As$ layer 14 (see FIG. 3) was formed on a semi-insulating GaAs substrate 11 by the MBE method. This barrier layer 14 had an impurity concentration as low as about $1\times10^{15}$ cm$^{-3}$ and a film thickness of about 0.5 μm. An undoped GaAs layer 12 as the channel layer was then formed by the MBE method to have an impurity concentration as low as about $1\times10^{15}$ cm$^{-3}$ and a film thickness of about 0.1 μm, and thereon a doped $Al_{0.5}Ga_{0.5}As$ layer 15 as the upper barrier layer was grown by the MBE method. Its impurity concentration was about $1\times10^{15}$ cm$^{-3}$ and its film thickness was about 300 Å. During the growth of the channel layer 12, a Si planar-doped layer 13 was formed formed by the molecular-beam epitaxy (MBE) method. The Si layer 13 was provided within the layer 12 at a position being apart by about 100 Å from the interface of the upper barrier layer 15 and the channel layer 12. Its impurity sheet density was about $5\times10^{12}$ cm$^{-2}$ and it has an approximate thickness of a monatomic layer.

Source and drain electrodes 16 and 18 were provided to have an interval of about 2 μm therebetween and formed by sputtering AuGe alloy and then Ni and alloying them with the semiconductor layers 15 and 12. A gate electrode 17 was formed of Al. The gate length Lg of the gate electrode was 0.5 μm.

The FET of the above EMBODIMENT 1 had the gate-forward turn-on voltage $V_{Gmax}$ of about +1.4 eV which was twice the $V_{Gmax}$ of the prior art planar-doped FET. The gate breakdown voltage was about −10 eV and the drain breakdown voltage was about +20 eV. An output current was also as large as about 600 mA/mm for a unit gate width. Moreover, a threshold voltage $V_T$ was about −3 eV (for Lg=0.5 μm). When a similar sample was formed with the gate length Lg of 10 μm, $V_T$ was about 2.9 eV. Thus, a shift amount of $V_T$ where the gate length Lg was lessened from 10 μm to 0.5 μm was as small as 100 mV. A drain conductance $g_d$ was also so small as 5 mS/mm when the gate length was 0.5 μm.

It is seen from the above that the present invention accomplishes the suppression of the short-channel effects and, in addition, enables the realization of the high-speed semiconductor device which is excellent in the high $V_{Gmax}$, the high breakdown voltage and the high current-driving capability.

The upper barrier layer 15 may be formed of an insulator such as $Al_2O_3$. It is necessary, on the occasion, to reduce an interface level sufficiently. It is favorable to provide a buffer layer, e.g. undoped GaAs layer, between the lower barrier layer 14 and the high-resistance substrate 11 in order to prevent the deterioration of the quality of crystals of the upper layers due to the interface level or impurities which are present on the interface. It is favorable to make the electron affinity of the lower semiconductor barrier layer 14 smaller than that of the channel layer 12 so as to suppress the short-channel effects in particular, though the electron affinity of the both layers 12 and 14 may be made the same. The short-channel effects can be suppressed further by making the lower barrier layer 14 be of a p-type at least at a portion thereof at or near the interface with the channel layer 12. In that case, an increase in the capacitance of the element should be prevented. A number of Si layers 13 may be provided in the channel layer 12 so as to make an output current high.

The channel layer 12 can also be formed of n-type GaAs having an impurity concentration of $1 \times 10^{19}$ to $1 \times 10^{16}$ cm$^{-3}$, for example, about $2 \times 10^{17}$ cm$^{-3}$, instead of the undoped GaAs, with the film thickness thereof made to be 2,000 Å to 10 Å, for example, 0.05 μm. In this case, a GaAs layer of low impurity concentration (i.e. of high purity) may be added to the channel layer at the interface with the upper semiconductor barrier layer (undoped AlGaAs) 15 to suppress the diffusion of the n-type impurity from the n-type GaAs layer into the upper barrier layer 15.

EMBODIMENT 2

Referring also to FIG. 3, a second embodiment will be described, which is the case where carriers are holes. In the present embodiment, a GaAs layer having an impurity concentration of about $1 \times 10^{15}$ cm$^{-3}$ and a film thickness of about 0.5 μm was used for a lower barrier layer 14 on a high-resistance GaAs substrate 11. A Ge layer having an impurity concentration of about $1 \times 10^{15}$ cm$^{-3}$ and a film thickness of about 0.1 μm was used for a channel layer 12 and an $Al_{0.1}Ga_{0.9}As$ layer having an impurity concentration of about $1 \times 10^{15}$ cm$^{-3}$ and a film thickness of about 500 Å was employed as an upper barrier layer 15. A Be layer having an impurity sheet density of about $1 \times 10^{13}$ cm$^{-2}$ and an approximate monatomic layer thickness was formed as an atomic planar-doped layer 13. Ohmic electrodes of AuZn for source 16 and drain 18 and a Schottky electrode of W for gate 17 were formed, respectively. The Be layer was provided in a position being apart by about 100 Å from the interface between the upper barrier layer 15 and the channel layer 12. The crystal growth of the layers 12 to 15 was made by the organometallic vapor phase epitaxy.

In the same way as in the EMBODIMENT 1, the shortchannel effects were suppressed and, in addition, the semiconductor device being excellent in the high $V_{Gmax}$, the high breakdown voltage and the high current-driving capability were realized in the present embodiment.

In this case also, a p-type Ge layer having an impurity concentration of about $2 \times 10^{17}$ cm$^{-3}$ may be used in a film thickness of about 0.05 μm as the channel layer 12, instead of the Ge layer of low impurity concentration.

I claim:

1. A planar-doped field-effect transistor comprising: a GaAs semiconductor substrate, a first semiconductor layer of GaAs of a low impurity concentration of about $1 \times 10^{16}$ to about $1 \times 10^{12}$ cm$^{-3}$ provided on said substrate, a second donor-planar-doped layer of a high-impurity concentration of about $1 \times 10^{14}$ to about $1 \times 10^{11}$ cm$^{-2}$ disposed in said first semiconductor layer, a third semiconductor layer of $Al_yGa_{1-y}As$, where $0 < y \leq 1$, of a low impurity concentration of about $1 \times 10^{16}$ to about $1 \times 10^{12}$ cm$^{-3}$ provided on said first semiconductor layer and having a smaller electron affinity than said first semiconductor layer, a gate electrode provided on the said third semiconductor layer, and two ohmic electrodes provided on the opposite sides of said gate electrode and connected electrically to said second layer, wherein said second layer is apart from said substrate and said third semiconductor layer.

2. The planar-doped field-effect transistor according to claim 1, further comprising: a fourth semiconductor layer of a low impurity concentration having a smaller electron affinity than said first semiconductor layer and formed between said substrate and said first semiconductor layer.

3. The planar-doped field-effect transistor according to claim 1, wherein $0.2 \leq y \leq 0.5$.

4. A planar-doped field-effect transistor comprising: a GaAs semiconductor substrate, a first semiconductor layer of Ge of a low impurity concentration provided on said substrate, a second high-impurity concentration acceptor-planar-doped layer disposed in said first semiconductor layer, a third semiconductor layer of $Al_yGa_{1-y}As$, where $0 < y \leq 1$, of a low impurity concentration provided on said first semiconductor layer and having a larger value of a sum of energy gap and electron affinity than said first semiconductor layer, a gate electrode provided on said third semiconductor layer, and two ohmic electrodes provided on the opposite sides of said gate electrode and connected electrically to said second layer, wherein said second layer is apart from said substrate and said third semiconductor layer.

5. A semiconductor device comprising: a first semiconductor layer provided on a substrate, a second semiconductor layer provided on said first semiconductor layer, a high-concentration, acceptor-doped impurity layer having a thickness of at least one atomic layer disposed in said second semiconductor layer, a third layer of a semiconductor of a low impurity concentration provided on said second semiconductor layer, and a control electrode provided on said third layer, and at least two ohmic electrodes provided on the opposite sides of said control electrode and connected electrically to said second semiconductor layer, wherein said second semiconductor layer is formed of one of a semiconductor of a p-type and a semiconductor of a low impurity concentration which has a smaller sum of electron affinity and energy gap than each semiconductor of said first semiconductor layer and said third layer, said acceptor-doped impurity layer being apart from said substrate and said third layer.

6. A planar-doped field-effect transistor comprising: a GaAs semiconductor substrate, a first semiconductor layer of Ge of a low impurity concentration provided on said substrate, a second high-impurity concentration acceptor-planar-doped layer disposed in said first semiconductor layer, a third semiconductor layer of $Al_yGa_{1-y}As$, where $0<y\leq 1$, of a low impurity concentration provided on said first semiconductor layer and having a larger value of a sum of energy gap and electron affinity than said first semiconductor layer, a gate electrode provided on said third semiconductor layer, and two ohmic electrodes provided on the opposite sides of said gate electrode and connected electrically to said second layer, wherein said second layer is apart from said substrate and said third semiconductor layer, and a fourth semiconductor layer of a low impurity concentration having a larger value of a sum of electron affinity and energy gap than said first semiconductor layer and formed between said substrate and said first semiconductor layer.

7. A semiconductor device comprising: a first semiconductor layer of $Al_xGa_{1-x}As$ where $0<x\leq 1$, provided on a GaAs substrate, a second semiconductor layer of undoped GaAs provided on said first semiconductor layer, a high-concentration impurity donor-planar-doped layer having a thickness of at least one atomic layer disposed in said second semiconductor layer, a third layer of an insulator of $Al_2O_3$ provided on said second semiconductor layer, and a control electrode provided on said third layer, and at least two ohmic electrodes provided on the opposite sides of said control electrode and connected electrically to said second semiconductor layer, wherein said donor-planar-doped layer is apart from said substrate and said third layer.

8. A semiconductor device comprising: a first semiconductor layer of GaAs provided on a GaAs substrate, a second semiconductor layer of Ge provided on said first semiconductor layer, a high-concentration impurity acceptor-planar-doped layer having a thickness of at least one atomic layer disposed in said second semiconductor layer, a third of a $Al_yGa_{1-y}As$ semiconductor of a low impurity concentration, where $0<y\leq 1$, provided on said second semiconductor layer, and a control electrode provided on said third layer, and at least two ohmic electrodes provided on the opposite sides of said control electrode and connected electrically to said second semiconductor layer, wherein said acceptor-planar-doped layer is apart from said substrate and said third layer.

9. The semiconductor device according to claim 5, wherein said substrate is GaAs, said first semiconductor layer is GaAs, said second semiconductor layer is a p-type Ge layer, said third semiconductor layer is $Al_yGa_{1-y}As$ where $0<y\leq 1$, and said high-concentration impurity layer is Be.

* * * * *